United States Patent
Wang et al.

(10) Patent No.: US 11,437,436 B2
(45) Date of Patent: Sep. 6, 2022

(54) SEMICONDUCTOR DEVICE AND METHOD FOR FORMING THE SAME

(71) Applicant: UNITED MICROELECTRONICS CORP., Hsin-Chu (TW)

(72) Inventors: Wen-Jen Wang, Tainan (TW); Chun-Hung Cheng, Kaohsiung (TW); Chuan-Fu Wang, Miaoli County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 23 days.

(21) Appl. No.: 17/084,609

(22) Filed: Oct. 29, 2020

(65) Prior Publication Data
US 2022/0102429 A1 Mar. 31, 2022

(30) Foreign Application Priority Data
Sep. 28, 2020 (CN) .......................... 202011037705.2

(51) Int. Cl.
*H01L 27/24* (2006.01)
*H01L 45/00* (2006.01)

(52) U.S. Cl.
CPC ...... *H01L 27/2463* (2013.01); *H01L 45/1675* (2013.01); *H01L 45/1233* (2013.01)

(58) Field of Classification Search
None
See application file for complete search history.

(56) References Cited

U.S. PATENT DOCUMENTS

| | | | |
|---|---|---|---|
| 9,099,647 B2 | 8/2015 | Liao | |
| 9,627,613 B2 | 4/2017 | Trinh | |
| 10,483,322 B2 | 11/2019 | Hsieh | |
| 2009/0025634 A1* | 1/2009 | Chung | B41J 2/14129 118/59 |
| 2010/0289098 A1 | 11/2010 | Li | |
| 2014/0264679 A1 | 9/2014 | Lee | |
| 2016/0351797 A1* | 12/2016 | Yi | H01L 43/12 |
| 2019/0165259 A1* | 5/2019 | Liao | H01L 27/228 |
| 2020/0152864 A1* | 5/2020 | Wu | H01L 43/02 |

* cited by examiner

*Primary Examiner* — Mounir S Amer
(74) *Attorney, Agent, or Firm* — Winston Hsu (57) ABSTRACT

A semiconductor device includes a substrate having a memory region and a logic region. A first dielectric layer is disposed on the substrate. A first conductive structure and a second conductive structure are formed in the first dielectric layer and respectively on the memory region and the logic region of the substrate. A memory cell is disposed on the first dielectric layer and directly contacts a top surface of the first conductive structure. A first cap layer is formed on the first dielectric layer and continuously covers a top surface and a sidewall of the memory cell and a top surface of the second conductive structure. A second dielectric layer is formed on the first cap. A third conductive structure is formed in the second dielectric layer and penetrates through the first cap layer to contacts the memory cell.

8 Claims, 10 Drawing Sheets

SEMICONDUCTOR DEVICE AND METHOD FOR FORMING THE SAME

BACKGROUND OF THE INVENTION

1. Field of the Invention

The invention relates to a semiconductor device and a method for forming the same. More particularly, the invention relates to a semiconductor device having a memory cell and a method for forming the same.

2. Description of the Prior Art

Emerging memory such as ferroelectric random access memory (FRAMs), phase-change random access memories (PRAMs), magnetic random access memories (MRAM), and resistive random access memories (RRAM) have drawn great attentions in the field due to their smaller feature sizes of memory cells, faster processing speeds, longer data retention periods, lower power consumptions, better reliabilities, and may be integrally formed with other semiconductor devices by the same manufacturing processes. How to integrate the memory cells into the semiconductor manufacturing process in a simpler way and having a stable process yield is an important research topic in this field.

SUMMARY OF THE INVENTION

The present invention is directed to provide a semiconductor device and a method for forming the same, which uses a first cap layer as an etching stop layer for the openings of the conductive structures and also as a sidewall protect layer for the memory cell. In this way, failure caused by over etching and misalignment of the conductive structures may be reduces. A simplified manufacturing process and an improved yield of the semiconductor device may be obtained.

According to one embodiment of the present invention, a semiconductor device is disclosed. The semiconductor device includes a substrate having a memory region and a logic region, a first dielectric layer on the substrate, a first conductive structure and a second conductive structure formed in the first dielectric layer and respectively on the memory region and the logic region of the substrate, a memory cell formed on the first dielectric layer and directly contacting a top surface of the first conductive structure, a first cap layer continuously covering a top surface and a sidewall of the memory cell and directly contacting a top surface of the second conductive structure, a second dielectric layer on the first cap layer, and a third conductive structure formed in the second dielectric layer and through the first cap layer to contact the memory cell.

According to another embodiment of the present invention, a method for forming a semiconductor device is disclosed. The method includes the steps of providing a substrate having a memory region and a logic region, forming a first dielectric layer on the substrate, forming a first conductive structure and a second conductive structure in the first dielectric layer and respectively on the memory region and the logic region of the substrate, forming a memory cell on first dielectric layer and directly contacting a top surface of the first conductive structure, forming a first cap layer covering a top surface and a sidewall of the memory cell and directly contacting a top surface of the second conductive structure, forming a second dielectric layer on the first cap layer, and forming a third conductive structure in the second dielectric layer and through the first cap layer to contact the memory cell.

These and other objectives of the present invention will no doubt become obvious to those of ordinary skill in the art after reading the following detailed description of the preferred embodiment that is illustrated in the various figures and drawings.

DETAILED DESCRIPTION

The following detailed descriptions and illustrations, with reference to the corresponding drawings, are used to illustrate the embodiments that may be implemented according to the present invention. These embodiments have provided enough details to enable those skilled in the art to fully understand and implement the present invention. Structural, logical and/or electrical modifications may be made and applied to other embodiments without departing from the scope of the present invention.

To provide a better understanding of the present invention to those of ordinary skill in the art, the accompanying drawings are included to provide a further understanding of the embodiments, and are incorporated in and constitute a part of this specification. The drawings of the present invention are only schematic drawings, and the size proportions of the elements represented in the drawings may be adjusted according to design requirements. The positional descriptions of the elements shown in the drawing such as "upper" and "lower" are relative. The drawings may be rotated to show the same structures, which should also be included in the scope of the present invention.

The terms "wafer" and "substrate" used herein include any structure having an exposed surface onto which a layer is deposited according to the present invention, for example, to form the circuit structure. The term substrate is understood to include semiconductor wafers, but not limited thereto. The term substrate is also used to refer to semiconductor structures during processing, and may include other layers that have been fabricated thereupon.

It should be understood that the meaning of "on", "above", "over", "under", "below", "beneath" and the like in the present disclosure should be interpreted in the broadest manner such that these terms not only means "directly on something" or "directly under something" but also includes the meaning of "on something with an intermediate feature or a layer therebetween" or "under something with an intermediate feature or a layer therebetween".

Furthermore, spatially relative terms, such as "beneath", "below", "under", "lower", "above", "upper", "on", "over" and the like may be used herein to describe one element or feature's spatial relationship to another element(s) or feature (s) as illustrated in the figures. The spatially relative terms are intended to encompass different orientations of the device in use or operation in addition to the orientation depicted in the figures. The structure may be otherwise oriented (rotated 90 degrees or at other orientations) and the spatially relative descriptors used herein may likewise be interpreted accordingly.

Figure 1:
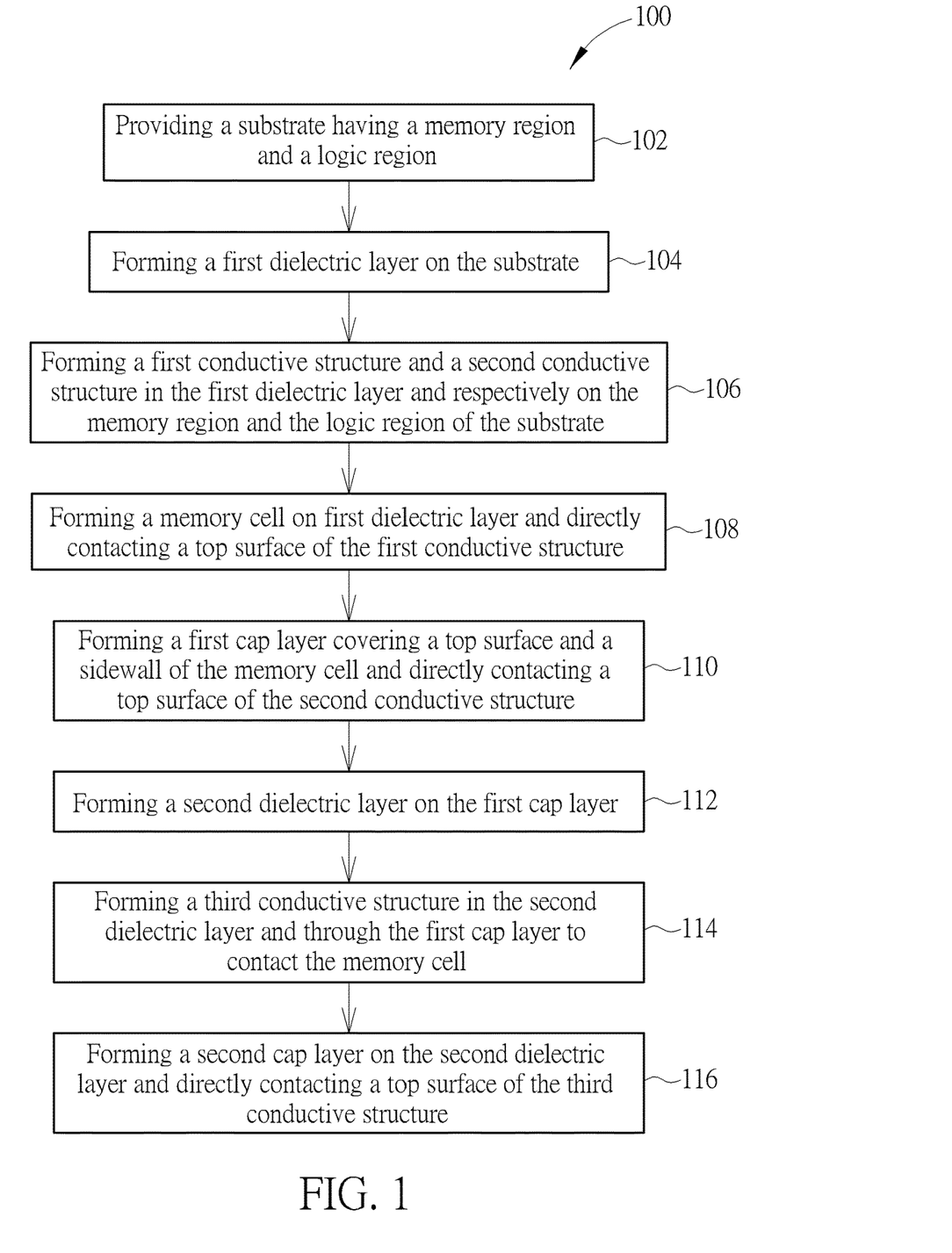
FIG. 1 illustrates a flowchart showing the steps of a method of manufacturing a semiconductor device according to an embodiment of the present invention.

FIG. 1 illustrates a flowchart showing the steps of a method of manufacturing a semiconductor device according to an embodiment of the present invention. FIG. 2 to FIG. 9 are schematic cross-sectional diagrams of the steps of a method of manufacturing a semiconductor device according to an embodiment of the present invention.

Figure 2:
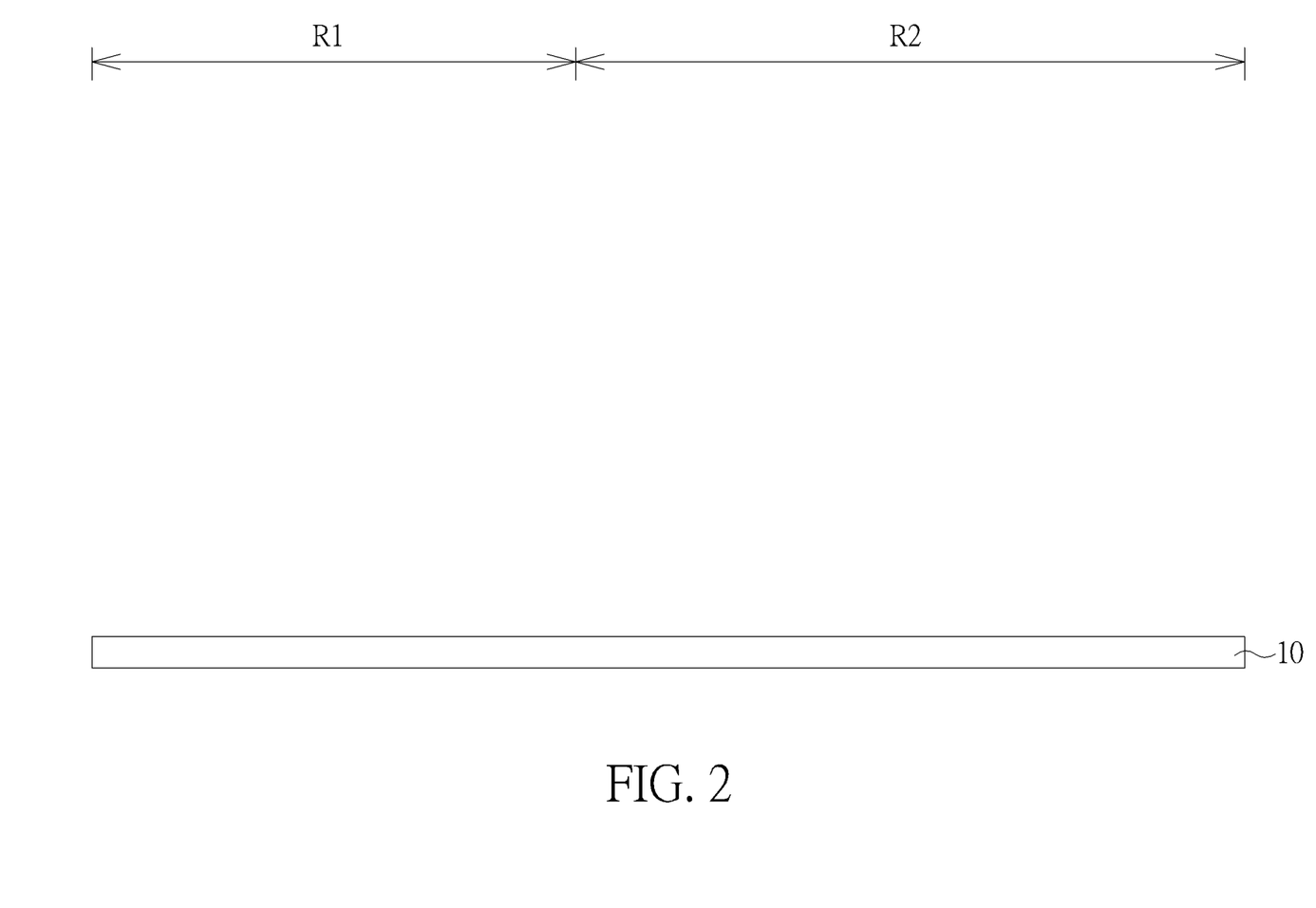
FIG. 2 to FIG. 9 are schematic cross-sectional diagrams illustrating the steps of a method of manufacturing a semiconductor device according to an embodiment of the present invention.

Please refer to FIG. 1 and FIG. 2. At the beginning of the method 100 of manufacturing a semiconductor device provided by the present invention, step 102 is performed to provide a substrate 10 including a memory region R1 and a logic region R2. The substrate 10 may be a semi-manufactured semiconductor substrate which has completed part of the manufacturing process. For example, the substrate 10 may be a semiconductor substrate that has completed the manufacturing steps of the front-end-on-line (FEOL) stage, and may include semiconductor devices such as insulating structures, transistors, and contact plugs formed therein. The substrate 10 may also have completed part of the manufacturing steps of the back-end-on-line (BEOL) stage, and may include at least one metal interconnection layer formed therein. To simplify the drawing and illustration, these structures of the substrate 10 are omitted in the drawings.

Figure 3:
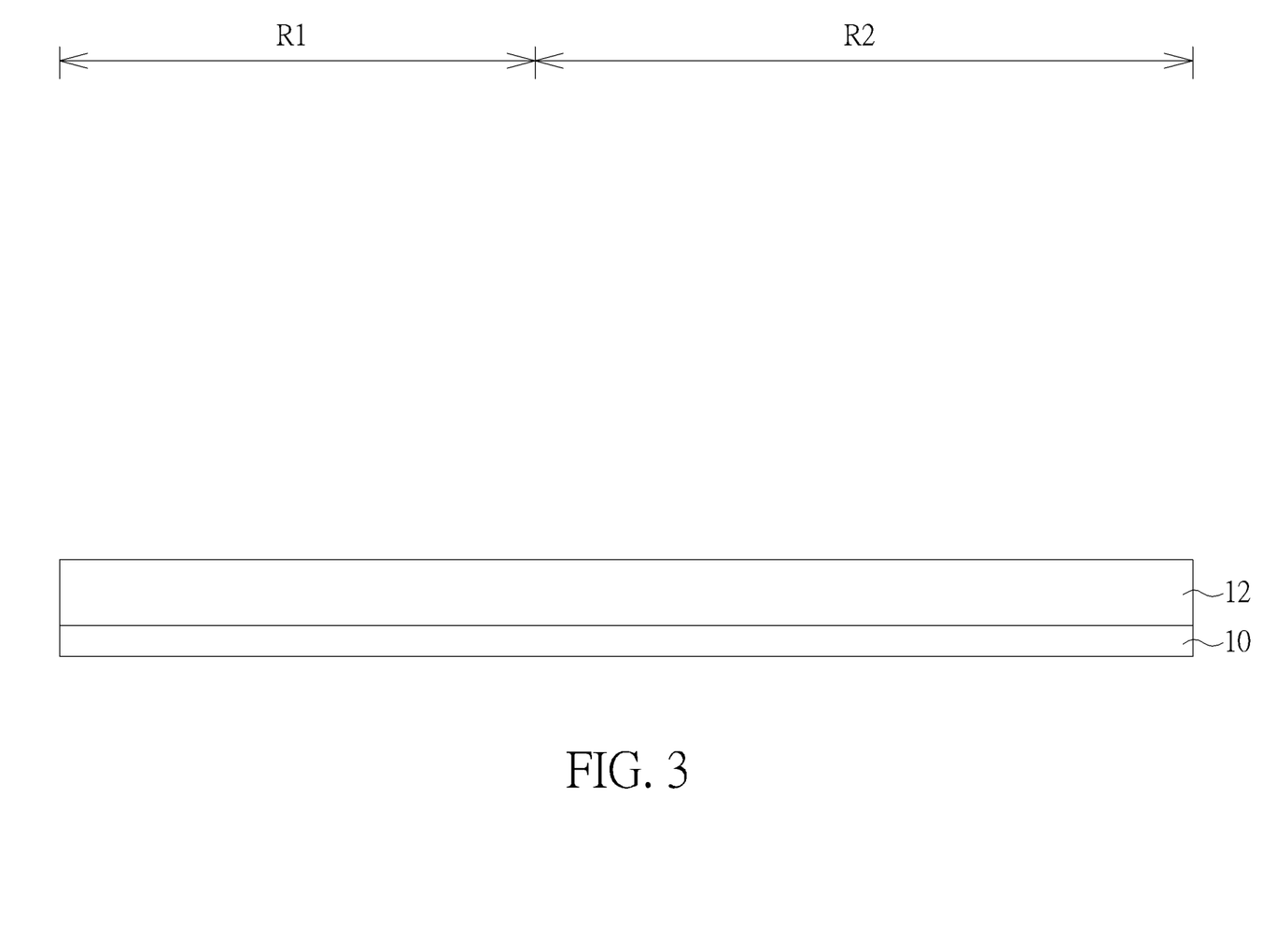

Please refer to FIG. 1 and FIG. 3. Subsequently, step 104 is performed to form a first dielectric layer 12 on the substrate 10. The first dielectric layer 12 may include a dielectric material such as silicon oxide (SiO$_2$) or undoped silica glass (USG), or may include a low-k dielectric material such as fluorinated silica glass (FSG), silicon oxycarbide (SiCOH), spin on glass, porous low-k dielectric material, or organic dielectric polymers, but not limited thereto.

Figure 4:
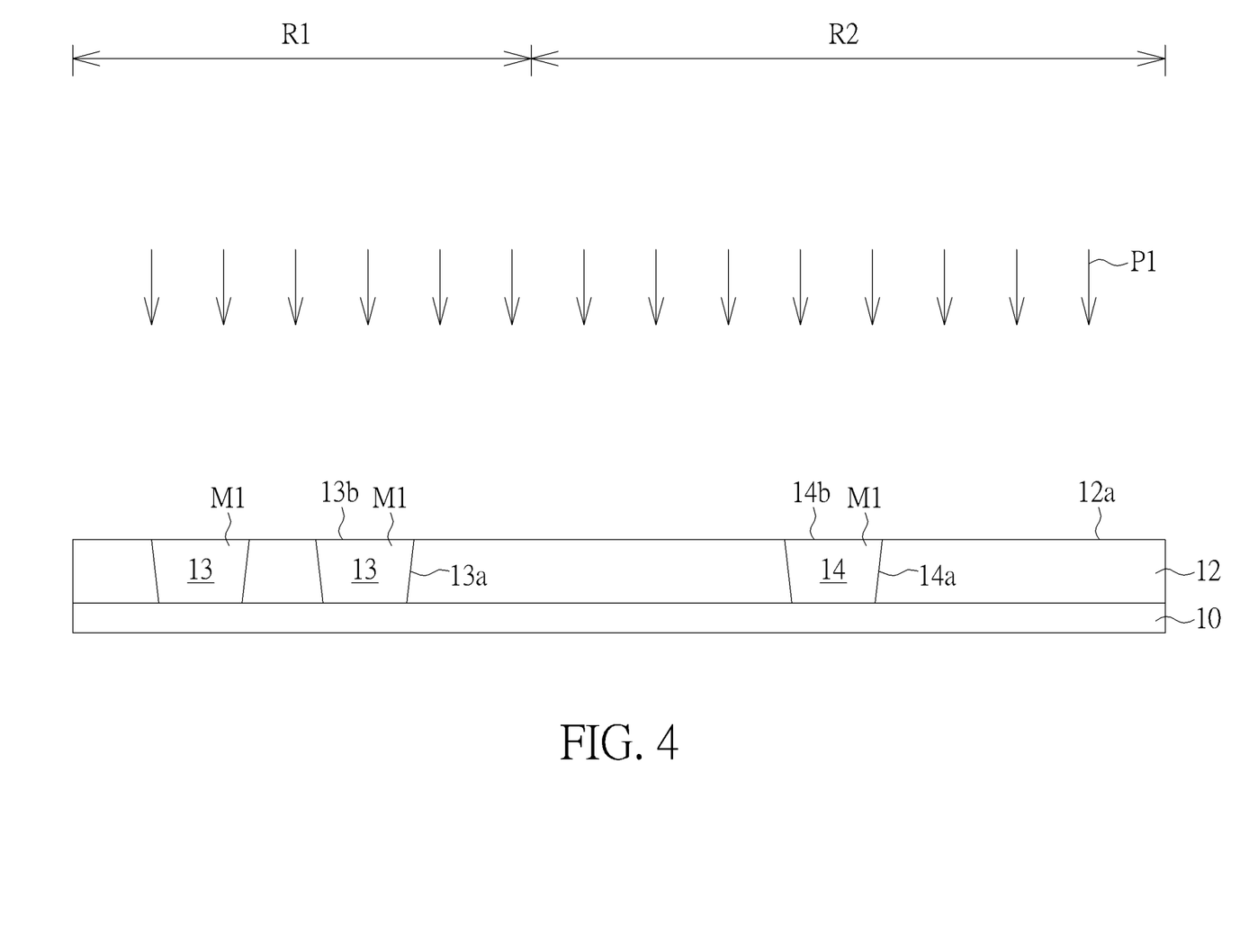

Please refer to FIG. 1 and FIG. 4. Subsequently, step 106 is performed to a first conductive structure 13 and a second conductive structure 14 in the first dielectric layer 12 and respectively on the memory region R1 and the logic region R2 of the substrate 10.

According to some embodiments of the present invention, the steps of forming the first conductive structure 13 and the second conductive structure 14 may include firstly, performing a patterning process (such as a photolithography-etching process) to form a first opening 13a in the first dielectric layer 12 on the memory region R1 and a second opening 14a in the first dielectric layer 12 on the logic region R2. After that, a first conductive layer M1 is formed on the first dielectric layer 12 in a blanket manner and fills the first opening 13a and the second opening 14a. Following, a first polishing process P1 is performed to remove the first conductive layer M1 outside the first opening 13a and the second opening 14a until exposing the upper surface 12a of the first dielectric layer 12, thereby obtaining the first conductive structure 13 and second conductive structure 14. The first conductive layer M1 may include a metal. For example, the first conductive layer M1 may include cobalt (Co), copper (Cu), aluminum (Al), tungsten (W), nickel (Ni), platinum (Pt), tantalum (Ta), titanium (Ti), or a compound, a composite layer or an alloy of the above materials, but is not limited thereto. In some embodiments, the first conductive layer M1 includes copper (Cu).

Figure 5:
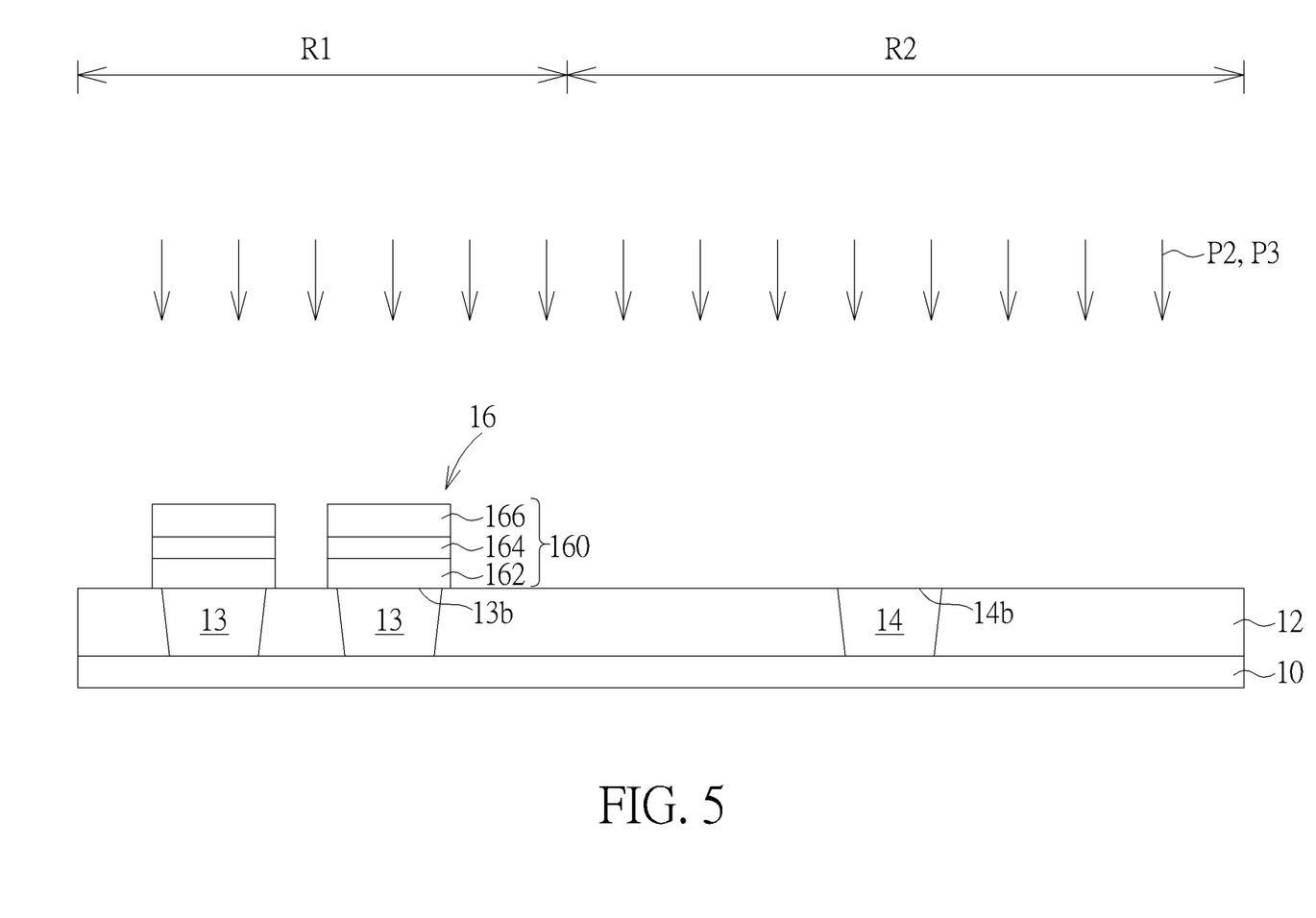

Please refer to FIG. 1 and FIG. 5. Subsequently, step 108 is performed to form a memory cell 16 on first dielectric layer 12. As shown in FIG. 5, the memory cell 16 directly contacts a top surface 13b of the first conductive structure 13.

According to some embodiments of the present invention, the memory cell 16 may be a resistive random-access memory (RRAM) cell, but is not limited thereto. According to some embodiments of the present invention, the memory cell 16 may be formed by forming a memory material layer 160 on the first dielectric layer 12 in a blanket manner, and then performing a patterning process P2 (such as a photolithography-etching process) to remove a portion of the memory material layer 160 on the memory region R1 to obtain the memory cell 16 corresponding to the first conductive structure 13. The memory material layer 160 on the logic region R2 is completely removed by the patterning process P2, thereby exposing the top surface 14b of the second conductive structure 14.

According to some embodiments of the present invention, the memory material layer 160 may include a bottom electrode layer 162 located at the bottom portion of the memory material layer 160 and directly contacting the first conductive structure 13, a memory layer 164 disposed on the bottom electrode layer 162, and a top electrode layer 166 disposed on the memory layer 164. The bottom electrode layer 162 and the top electrode layer 166 may include conductive materials, such as titanium (Ti), titanium nitride (TiN), tantalum (Ta), tantalum nitride (TaN), platinum (Pt), iridium (Ir), ruthenium (Ru), aluminum (Al), copper (Cu), gold (Au), tungsten (W), or compounds, composite layers or alloys of the above materials, but are not limited thereto. The materials of the bottom electrode layer 162 and the top electrode layer 166 may be the same or different. The memory layer 164 may include a variable-resistance material, such as nickel oxide (NiO), titanium dioxide (TiO), zinc oxide (ZnO), zirconium oxide (ZrO), hafnium oxide (HfO), tantalum oxide (TaO) or other transition metal oxides (TMO), but is not limited thereto. According to some embodiments of the present invention, the bottom electrode layer 162, the memory layer 164, and/or the top electrode layer 166 may respectively have a multi-layer structure, which is not shown in the drawings for the sake of simplicity.

According to some embodiments of the present invention, optionally, an oxidation process P3 may be performed to oxidize the sidewall of the memory cell 16 after the patterning process P2. The oxidation process P3 may oxidize the metal residues adsorbed on the sidewall of the memory cell 16 during the etching process of the patterning process P2 into non-conductive oxides, and/or may repair the damaged portions of the bottom electrode layer 162, the memory layer 164 and the top electrode layer 166.

Figure 6:
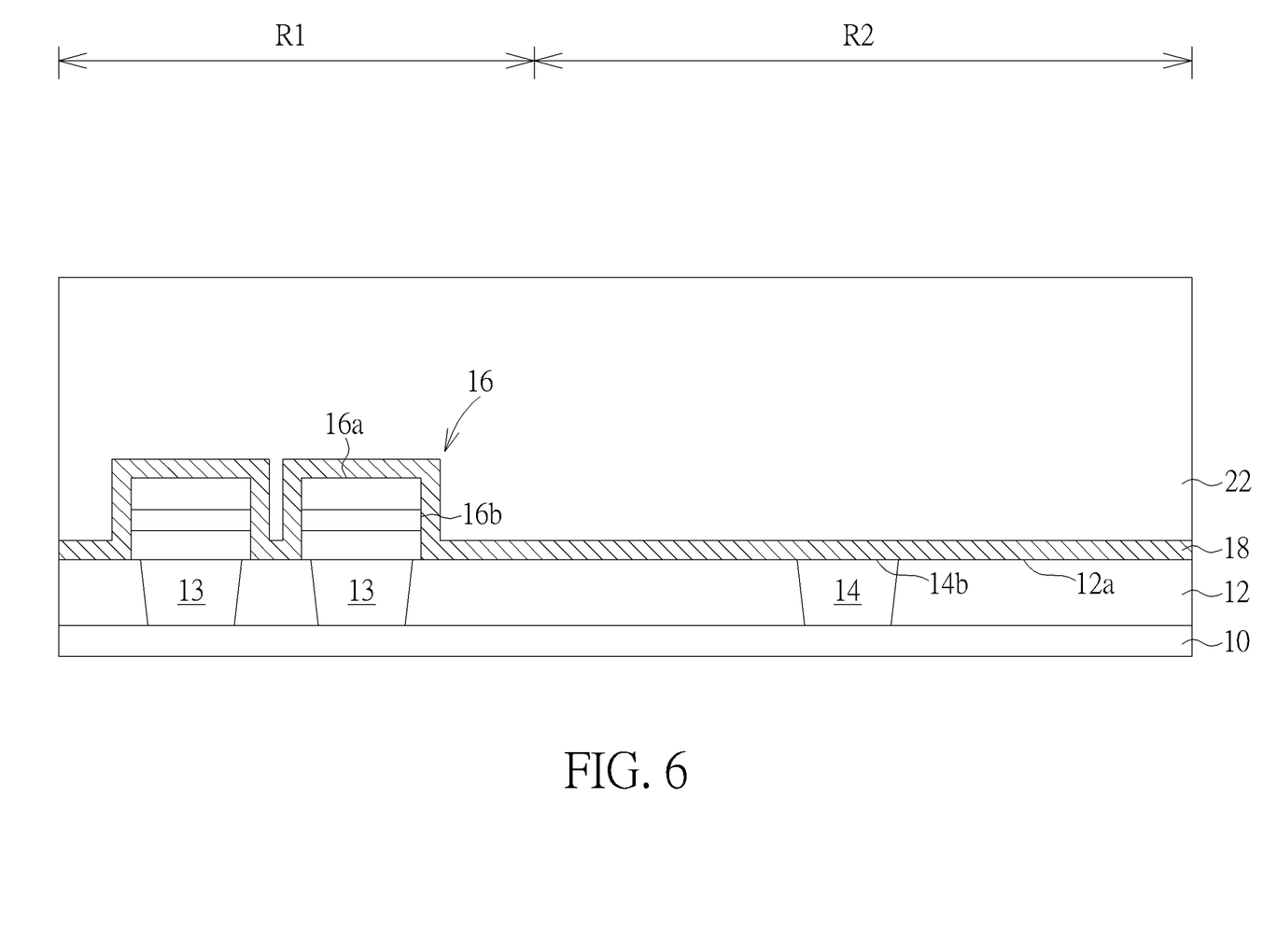

Please refer to FIG. 1 and FIG. 6. Subsequently, step 110 is performed to form a first cap layer 18 on the first dielectric layer 12. Following, step 112 is performed to form a second dielectric layer 22 on the first cap layer 18. As shown in FIG. 6, the first cap layer 18 is formed on the first dielectric layer 12 in a blanket manner and continuously and conformally covers the upper surface 12a of the first dielectric layer 12 and the top surface 16a and sidewall 16b of the memory cell 16. The first cap layer 18 directly contacts the top surface 14b of the second conductive structure 14.

According to some embodiments of the present invention, the material of the first cap layer 18 may include a dielectric material. For example, the material of the first cap layer 18 may include silicon nitride (SiN), silicon oxynitride (SiON), silicon carbide nitride (SiCN), or nitrogen doped silicon carbide (NDC), but is not limited thereto. In some preferred embodiments, the material of the first cap layer 18 includes nitrogen doped silicon carbide (NDC). The second dielectric layer 22 may include a dielectric material such as silicon oxide (SiO2) or undoped silica glass (USG), or may include a low-k dielectric material such as fluorinated silica glass (FSG), silicon oxycarbide (SiCOH), spin on glass, porous low-k dielectric material, or organic dielectric polymers, but not limited thereto. According to some embodiments of the present invention, the first dielectric layer 12 and the second dielectric layer 22 may include the same dielectric material, such as a low-k dielectric material.

Figure 7:
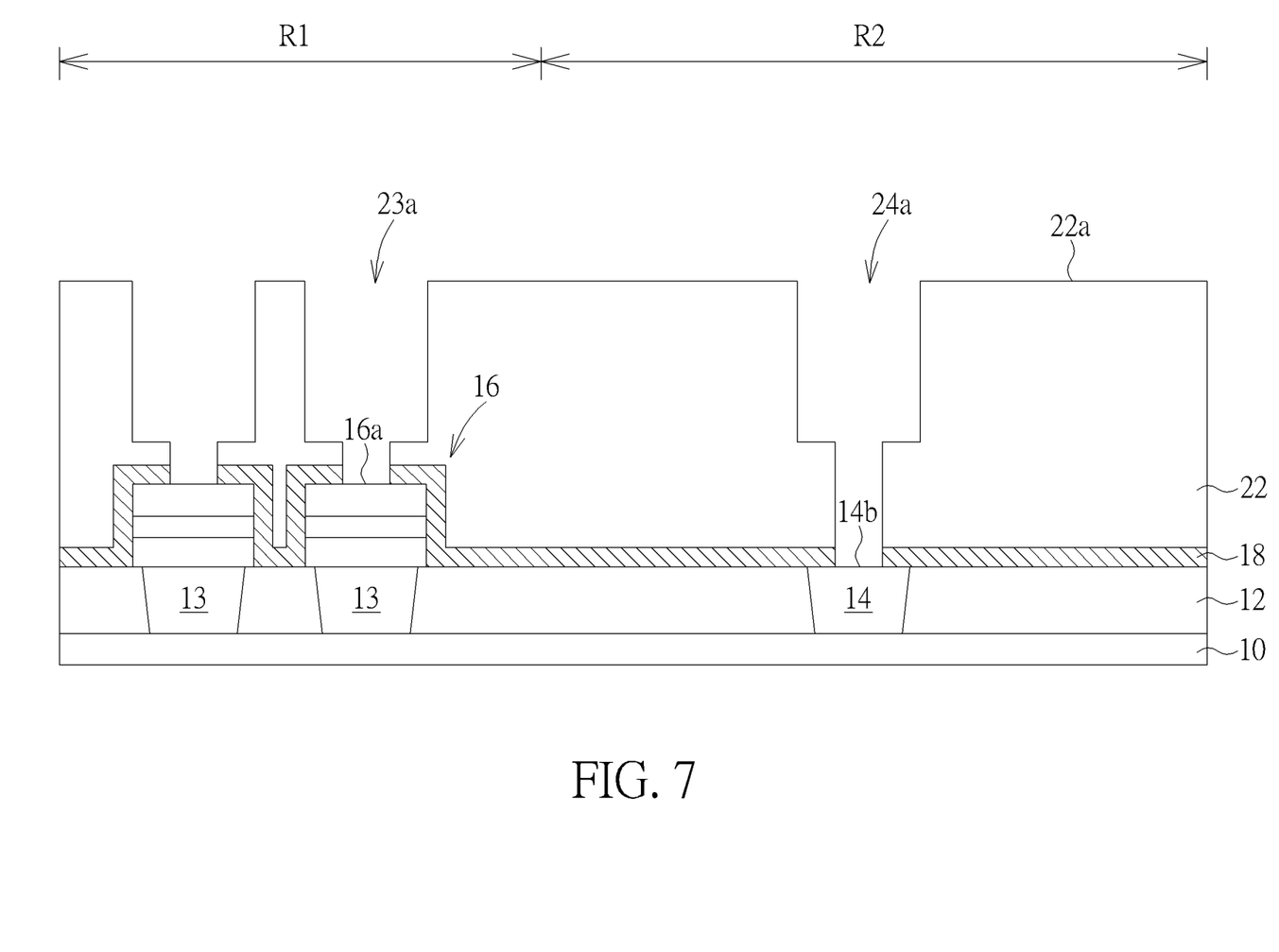
Figure 8:
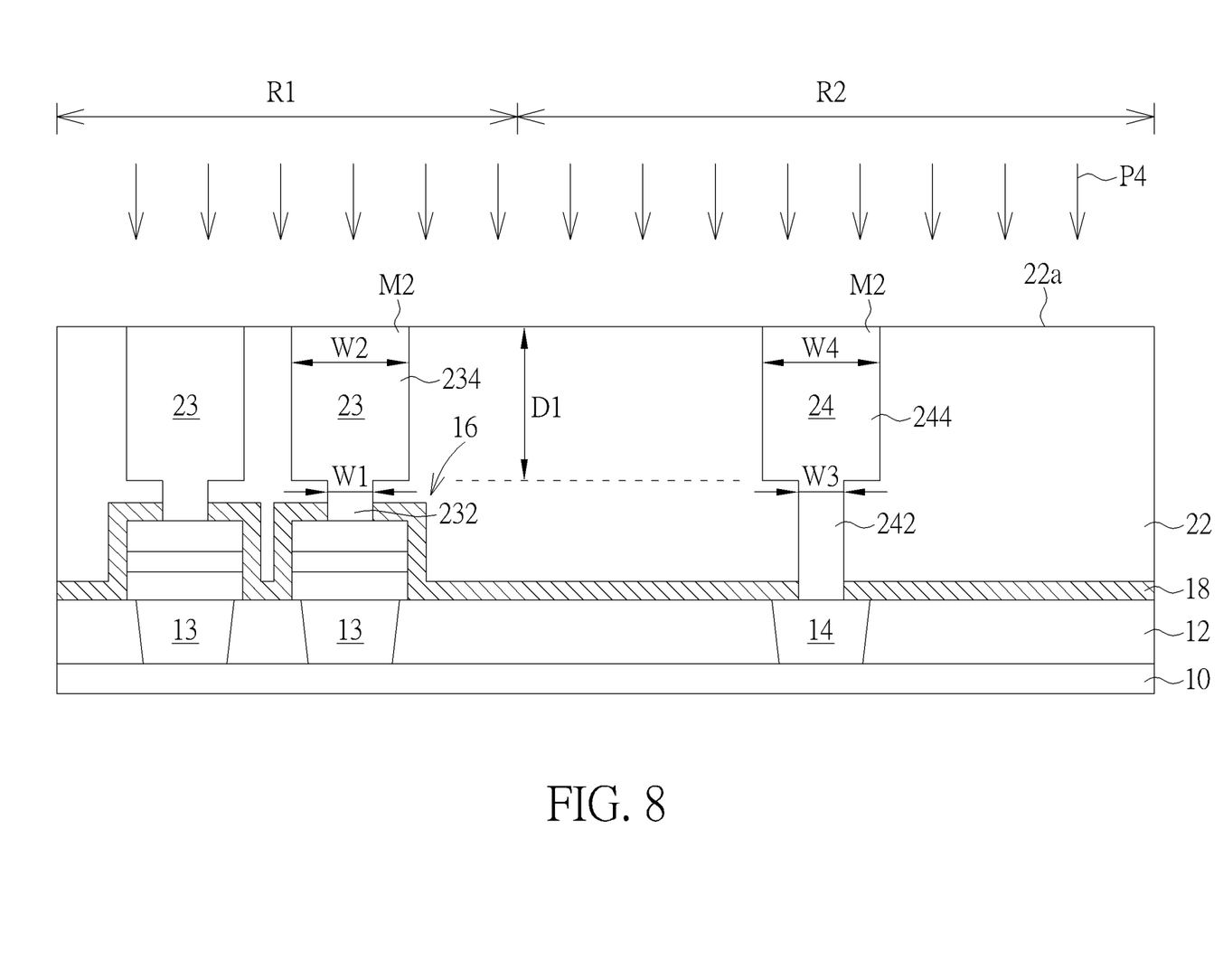

Please refer to FIG. 1, FIG. 7 and FIG. 8. Subsequently, step 114 is performed to form a third conductive structure 23 in the second dielectric layer 22 on the memory region R1 and through the first cap layer 18 to directly contact the memory cell 16.

According to some embodiments of the present invention, the third conductive structure 23 may be formed by performing a dual-damascene process. The steps of the dual-damascene process may include, for example, performing a double patterning process (such as a double lithography-etching process) on the second dielectric layer 22 to form a third opening 23a penetrating through second dielectric layer 22 and the first cap layer 18 on the memory region R1 of the substrate 10 and exposing the top surface 16a of the memory cell 16. After that, a second conductive layer M2 is formed on the second dielectric layer 22 in a blanket manner and fills the third opening 23a. Following, a second polishing process P4 is performed to remove the second conductive layer M2 outside the third opening 23a until exposing the upper surface 22a of the second dielectric layer 22, thereby obtaining the third conductive structure 23 as shown in FIG. 8. The second conductive layer M2 may include a metal. For example, the second conductive layer M2 may include cobalt (Co), copper (Cu), aluminum (Al), tungsten (W), nickel (Ni), platinum (Pt), tantalum (Ta), titanium (Ti), or a compound, a composite layer or an alloy of the above materials, but is not limited thereto. In some embodiments, the second conductive layer M2 includes copper (Cu). The first cap layer 18 may be used as an etch stop layer to prevent the top electrode layer 166 of the memory cell 16 from being over etched during the etching process for forming the third opening 23a.

According to some embodiments of the present invention, as shown in FIG. 8, the third conductive structure 23 may include a lower portion 232 and an upper portion 234 on the lower portion 232. The lower portion 232 is in direct contact with the memory unit 16. The upper portion 234 is exposed from the upper surface 22a of the second dielectric layer 22. According to some embodiments of the present invention, a width W2 of the upper portion 234 is larger than a width W1 of the lower portion 232. The bottom surface of the upper portion 234 of the third conductive structure 23 is higher than the top surface 16a of the memory unit 16.

According to some embodiments of the present invention, a barrier layer (not shown) may be formed on the second dielectric layer 22 before forming the second conductive layer M2 and may cover the sidewall and bottom surface of the third opening 23a. The material of the barrier layer may include titanium (Ti), titanium nitride (TiN), tantalum (Ta), tantalum nitride (TaN), tungsten nitride (WN), or a combination thereof, but is not limited thereto. The barrier layer outside the third opening 23a may be removed during the second polishing process P4.

According to some embodiments of the present invention, a fourth conductive structure 24 may be formed at the same time when forming the third conductive structure 23. The fourth conductive structure 24 is formed in the second dielectric layer 22 on the logic region R2 of the substrate 12 and penetrates through the first cap layer 18 to directly contact the second conductive structure 14.

For example, as shown in FIG. 7 and FIG. 8, the fourth conductive structure 24 and the third conductive structure 23 may be formed by the same dual damascene process, which includes forming a fourth opening 24a through the second dielectric layer 22 and the first cap layer 18 and exposing the top surface 14b of the second conductive structure 14 at the same time when forming the third opening 23a. After that, the barrier layer (not shown) and the second conductive layer M2 are formed on the second dielectric layer 22 in a blanket manner and concurrently fill the third opening 23a and the fourth opening 24a. Following, the second polishing process P4 is performed to remove the barrier layer (not shown) and the second conductive layer M2 outside the third opening 23a and the fourth opening 24a until exposing the upper surface 22a of the second dielectric layer 22, thereby obtaining the third conductive structure 23 and the fourth conductive structure 24 as shown in FIG. 8. The first cap layer 18 may be used as an etch stop layer to prevent the top electrode layer 166 of the memory cell 16 and the second conductive structure 14 from being over etched during the etching process for forming the third opening 23a and the fourth opening 24a.

According to some embodiments of the present invention, as shown in FIG. 8, the fourth conductive structure 24 may include a lower portion 242 and an upper portion 244 on the lower portion 242. The lower portion 242 is in direct contact with the second conductive structure 14. The upper portion 244 is exposed from the upper surface 22a of the second dielectric layer 22. According to some embodiments of the present invention, a width W4 of the upper portion 234 is larger than a width W3 of the lower portion 232. The bottom surface of the upper portion 234 of the third conductive structure 23 and the bottom surface of the upper portion 244 of the fourth conductive structure 24 may be substantially located at the same depth D1 from the upper surface 22a of the second dielectric layer 22. The bottom surface of the upper portion 244 of the fourth conductive structure 24 may be higher than the top surface 16a of the memory unit 16.

One feature of the present invention is that, the first cap layer 18 that is formed to continuously cover the upper surface 12a of the first dielectric layer 12, the top surface 16a and sidewall 16b of the memory cell 16, and the top surface 14b of the second conductive structure 14 may be used as an etch stop layer to prevent the top electrode layer 166 of the memory cell 16 and the second conductive structure 14 from being over etched when forming the third opening 23a and the fourth opening 24a, as well as be used as a sidewall protecting layer to avoid the exposure of the sidewall 16b of the memory cell 16 due to a misalignment of the third opening 23a. Accordingly, the electrical failure of the memory cell 16 may be reduced. The semiconductor device provided by the present invention may have a better yield and a simplified manufacturing process.

Figure 9:
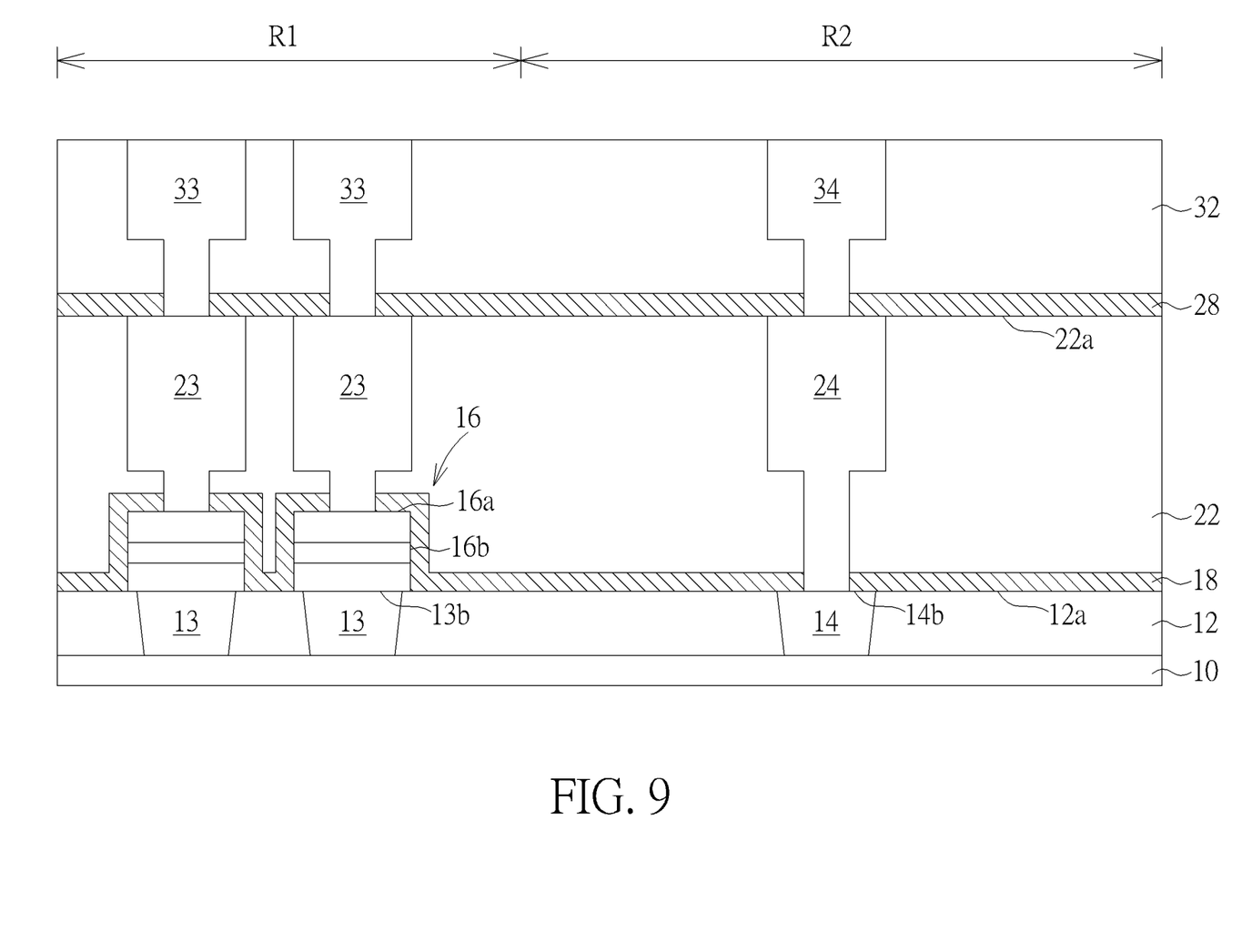

Please refer to FIG. 1 and FIG. 9. Subsequently, step 116 is performed to form a second cap layer 28 on the second dielectric layer 22 and a third dielectric layer 32 on the second cap layer 28. The second cap layer 28 directly covers the top surfaces of the third conductive structure 23 and the fourth conductive structure 24. Following, a fifth conductive structure 33 and a sixth conductive structure 34 penetrating through the third dielectric layer 32 and the second capping layer 28 and directly contacting the third conductive structure 23 and the fourth conductive structure 24, respectively, may be formed.

According to some embodiments of the present invention, the material of the second cap layer 28 may include a dielectric material. For example, the material of the second cap layer 28 may include silicon nitride (SiN), silicon oxynitride (SiON), silicon carbide nitride (SiCN), or nitrogen doped silicon carbide (NDC), but is not limited thereto. Preferably, the second cap layer 28 and the first cap layer 18 may include the same material, such as nitrogen-doped carbon silicide (NDC). The third dielectric layer 32 may include a dielectric material such as silicon oxide (SiO2) or undoped silica glass (USG), or may include a low-k dielectric material such as fluorinated silica glass (FSG), silicon oxycarbide (SiCOH), spin on glass, porous low-k dielectric material, or organic dielectric polymers, but not limited thereto. According to some embodiments of the present invention, the third dielectric layer 32 and the second dielectric layer 22 may include the same dielectric material, such as a low-k dielectric material. The fifth conductive structure 33 and the sixth conductive structure 34 may respectively include a metal, such as cobalt (Co), copper (Cu), aluminum (Al), tungsten (W), nickel (Ni), platinum (Pt), tantalum (Ta), titanium (Ti), or a compound, a composite layer or an alloy of the above materials, but is not limited thereto. In some embodiments, the third conductive structure 23, the fourth conductive structure 24, the fifth conductive structure 33, and the sixth conductive structure 34 may include the same metal material, such as copper (Cu).

The fifth conductive structure 33 and the sixth conductive structure 34 may be formed by performing a dual-damascene process as illustrated previously with respect to the third conductive structure 23 and the fourth conductive structure 24, and will not be repeated herein for the sake of brevity. The second cap layer 28 may be used as an etching stop layer in the etching process for forming the fifth conductive structure 33 and the sixth conductive structure 34. In some embodiments, a barrier layer (not shown) may be formed between the fifth conductive structure 33 and the third dielectric layer 32 and also between the sixth conductive structure 34 and the third dielectric layer 32.

Please continue to refer to FIG. 9. In detail, the semiconductor device provided by the present invention includes a substrate 10 having a memory region R1 and a logic region R2, a first dielectric layer 12 on the substrate 10, a first conductive structure 13 and a second conductive structure 14 formed in the first dielectric layer 12 and respectively on the memory region R1 and the logic region R2 of the substrate 10, a memory cell 16 formed on the first dielectric layer 12 and directly contacting a top surface 13b of the first conductive structure 13, a first cap layer 18 disposed on the first dielectric layer 12 and continuously covering a top surface 16a and a sidewall 16b of the memory cell 16 and directly contacting a top surface 14b of the second conductive structure 14, a second dielectric layer 22 on the first cap layer 18, and a third conductive structure 23 formed in the second dielectric layer 22 and through the first cap layer 18 to contact the memory cell 16.

According to some embodiments of the present invention, by controlling the first polishing process P1 and the etching process of the memory material layer 160, the top surface 13b of the first conductive structure 13, the top surface 14b of the second conductive structure 14b, and the top surface 12a of the first dielectric layer 12 may be substantially flush with each other. According to some embodiments of the present invention, by controlling the second polishing process P4, the top surface of the third conductive structure 23, the top surface of the fourth conductive structure 24, and the upper surface 22a of the second dielectric layer 22 may be substantially flush with each other.

Figure 10:
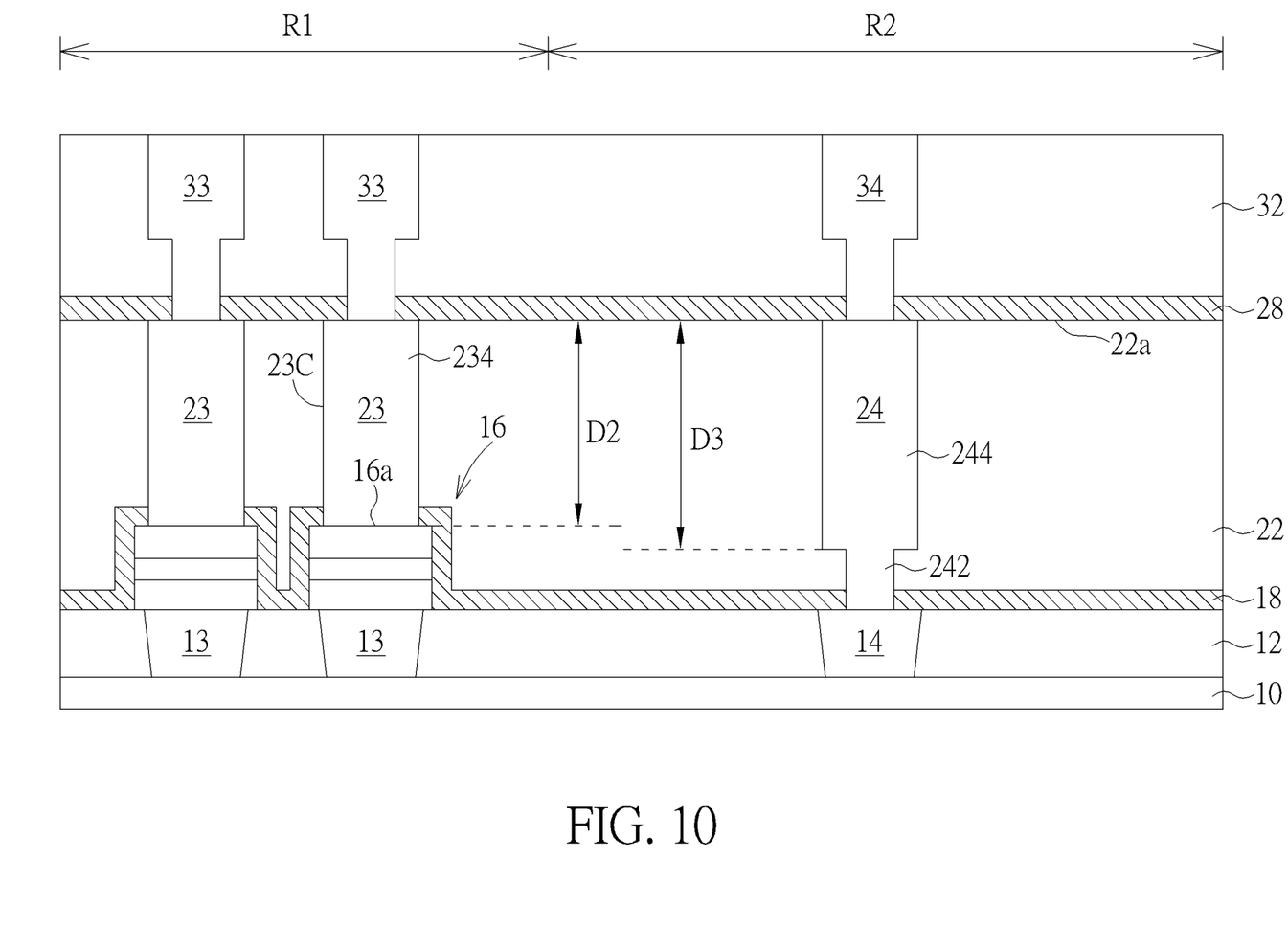
FIG. 10 is a schematic cross-sectional diagram of a semiconductor device according to another embodiment of the present invention.

Please refer to FIG. 10, which is a schematic cross-sectional diagram of a semiconductor device according to another embodiment of the present invention. To simplify the description and also facilitate the comparison of the embodiment shown in FIG. 10 to that shown FIG. 9, the same elements shown in FIG. 10 and FIG. 9 are marked with the same reference numbers. The semiconductor device shown in FIG. 10 is different from that shown in FIG. 9 in that, the third conductive structure 23 of the semiconductor device shown in FIG. 10 contacts the memory cell 16 by the upper portion 234 and may include a straight sidewalls 23c extending from the upper surface 22a of the second dielectric layer 22 to the top surface 16a of the memory cell 16. The bottom surface of the upper portion 244 of the fourth conductive structure 24 may be located at a depth D3 from the upper surface 22a of the second dielectric layer 22 that is deeper than a depth D2 of the bottom surface of the upper portion 234 of the third conductive structure 23 that contacts the memory unit 16. The bottom surface of the upper portion 244 of the fourth conductive structure 24 may be lower than the top surface 16a of the memory unit 16.

In summary, the semiconductor device provided by the present invention uses the first cap layer as an etching stop layer for forming the third opening of the third conductive structure and the fourth opening of the fourth conductive structure as well as a sidewall protect layer for the memory cell to reduce failure caused by over etching and misalignment of the conductive structures. A simplified manufacturing process and an improved yield of the semiconductor device may be obtained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor device, comprising:
    providing a substrate having a memory region and a logic region;
    forming a first dielectric layer on the substrate;
    forming a first conductive structure and a second conductive structure in the first dielectric layer and respectively on the memory region and the logic region of the substrate;
    forming a memory cell on first dielectric layer, the memory cell comprising:
        a bottom electrode directly contacting a top surface of the first conductive structure;
        a memory layer on the bottom electrode; and
        a top electrode on the memory layer;
    forming a first cap layer continuously covering the memory region and the logic region and directly contacting a top surface and a sidewall of the top electrode, a sidewall of the memory layer, a sidewall of the bottom electrode and a top surface of the second conductive structure;
    forming a second dielectric layer on the first cap layer; and
    forming a third conductive structure in the second dielectric layer and through the first cap layer to contact the top electrode.

2. The method according to claim 1, wherein the step of forming the first conductive structure and the second conductive structure comprises:
- forming a first opening in the first dielectric layer on the memory region and a second opening in the first dielectric layer on the logic region;
- forming a first conductive layer on the first dielectric layer and filling the first opening and the second opening; and
- performing a first polishing process to remove the conductive layer outside the first opening and the second opening and expose the first dielectric layer.

3. The method according to claim 1, wherein the step of forming the memory cell comprises:
- forming a memory material layer on the first dielectric layer; and
- performing a patterning process to pattern the memory material layer on the memory region into the top electrode, the memory layer and the bottom electrode, and to remove the memory material layer on the logic region to expose the second conductive structure.

4. The method according to claim 3, further comprising performing an oxidation process to oxidize the sidewall of the top electrode, the sidewall of the memory layer, and the sidewall of the bottom electrode after the patterning process.

5. The method according to claim 1, the step of forming the third conductive structure comprises:
- forming a third opening through the second dielectric layer and the first cap layer to expose the top surface of the top electrode;
- forming a second conductive layer on the second dielectric layer and filling the third opening; and
- performing a second polishing process to remove the second conductive layer outside the third opening.

6. The method according to claim 5, further comprising:
- forming a fourth opening in the second dielectric layer when forming the third opening, wherein the fourth opening exposes a top surface of the second conductive structure;
- filling the second conductive layer into the fourth opening; and
- removing the second conductive layer outside the fourth opening by the second CMP process.

7. The method according to claim 1, further comprising forming a second cap layer on the second dielectric layer and directly contacting a top surface of the third conductive structure, wherein the first cap layer and the second cap layer comprise a same dielectric material.

8. The method according to claim 7, wherein the first cap layer and the second cap are made of nitride doped silicon carbide, the first dielectric layer and the second dielectric layer are made of low-k dielectric materials.

* * * * *